United States Patent [19]

Ichihara

[11] Patent Number: 5,705,912

[45] Date of Patent: Jan. 6, 1998

[54] CIRCUIT FOR PREVENTING OVERDISCHARGE OF RECHARGEABLE BATTERY PACK CONSISTING OF A PLURALITY OF RECHARGEABLE BATTERIES

[75] Inventor: Masaki Ichihara, Tokyo, Japan

[73] Assignee: NEC Corporation, Tokyo, Japan

[21] Appl. No.: 307,154

[22] Filed: Sep. 16, 1994

[30] Foreign Application Priority Data

Sep. 17, 1993 [JP] Japan .................................. 5-231510

[51] Int. Cl.6 .................................................. H01M 10/46
[52] U.S. Cl. ................................ 320/6; 320/13; 320/15
[58] Field of Search ........................ 320/6, 7, 15, 13,
320/17, 30, 39, 48, 18, 40; 324/433, 434;
340/636

[56] References Cited

U.S. PATENT DOCUMENTS

| | | | |
|---|---|---|---|
| 4,280,097 | 7/1981 | Carey et al. | 320/48 X |
| 4,303,877 | 12/1981 | Meinhold | 320/6 |
| 4,823,086 | 4/1989 | Whitmire et al. | 324/434 |
| 4,833,459 | 5/1989 | Geuer et al. | 320/48 X |
| 5,206,578 | 4/1993 | Nor | 320/18 X |
| 5,298,821 | 3/1994 | Michel | 320/2 X |
| 5,387,857 | 2/1995 | Honda et al. | 320/18 |
| 5,422,558 | 6/1995 | Stewart | 320/7 |

FOREIGN PATENT DOCUMENTS

| | | |
|---|---|---|
| 2063686 | 10/1992 | Canada . |
| 279736 | 3/1990 | Japan . |
| 4331425 | 11/1992 | Japan . |
| 1461616 | 1/1977 | United Kingdom . |
| 1571473 | 7/1980 | United Kingdom . |
| 2086060 | 5/1982 | United Kingdom . |
| 2132005 | 6/1984 | United Kingdom . |
| 2226716 | 7/1990 | United Kingdom . |
| WO92 22098 | 12/1982 | WIPO . |

Primary Examiner—Edward Tso
Attorney, Agent, or Firm—Sughrue, Mion, Zinn, Macpeak & Seas

[57] ABSTRACT

A rechargable battery pack is constituted by not connecting all of the terminals of a plurality of secondary batteries but extracting them outside. A charging circuit is constituted by a dedicated charging circuit which comprises a constant-voltage circuit and a constant-current circuit for each of the rechargable batteries to charge each rechargable battery separately. A discharging circuit comprises, for each of the rechargable batteries, a controler for preventing an overdischarge and a worning portion for warning of an overdischarge.

10 Claims, 2 Drawing Sheets

CIRCUIT FOR PREVENTING OVERDISCHARGE OF RECHARGEABLE BATTERY PACK CONSISTING OF A PLURALITY OF RECHARGEABLE BATTERIES

BACKGROUND OF THE INVENTION

1. Field of the Invention

The present invention relates to a charging and discharging circuit for a rechargeable battery, and, more particularly, to a charging and discharging circuit for preventing the overcharge and overdischarge of a rechargeable battery pack including a plurality of rechargeable batteries.

2. Description of the Related Art

Recently, much has come to be expected of the rechargeable lithium ion battery regarding the expansion of its future applications to portable radio phones, very small personal computers, small video cameras, and the like because it has a higher energy density per volume and weight than a nickel-cadmium battery or a nickel metal hydride battery, and a voltage of 2.5–4.2 V, higher than the 1.2 V of the nickel-cadmium battery or the nickel metal hydride battery.

If the rechargeable lithium ion battery is overcharged at a voltage higher than its maximum voltage of 4.2 V or overdischarged to a voltage lower than its minimum voltage of 2.5 V, however, it has a problem such that lithium metal is deposited on the electrode, reacts with water, and is ignited.

In addition, a plurality of rechargeable lithium ion batteries is frequently connected in series for use. In such a case, the possibility of ignition increases and causes a serious problem.

Conventionally, to solve such a problem, as shown in Japanese patent Application laid-open No. 4-331425 published Nov. 19, 1992 (Reference 1), a charging/discharging circuit for the rechargeable lithium ion battery is generally used to prevent overcharge by detecting the voltage across the terminals of each of the series-connected rechargeable batteries, and to prevent overdischarge by detecting the voltage across the terminals at both ends of the series-connected rechargeable batteries.

That is, the charging/discharging circuit described in Reference 1 employs an arrangement which detects such a voltage and stops charging if even one of the series-connected rechargeable lithium ion batteries is charged at a voltage higher than the maximum voltage.

In addition, the charging/discharging circuit described in Reference 1 employs an arrangement which detects the voltage across the terminals at both ends of the series-connected rechargeable lithium ion batteries when they are discharged, and stops the discharge if a voltage lower than the minimum voltage is supplied to a load to which the power from the secondary lithium ion batteries is supplied.

Therefore, the charging/discharging circuit described in Reference 1 can prevent the overcharge and the overdischarge of the rechargeable lithium ion battery.

A charging/discharging circuit for the rechargeable lithium ion battery known other than that described in Reference 1 is described in Japanese patent Application laid-open No. 2-79730 published Mar. 20, 1990 (Reference 2).

The charging/discharging circuit for the rechargeable lithium ion battery described in Reference 2 comprises a plurality of rechargeable batteries and a plurality of switches, and employs an arrangement which enables the selection, by operating the switches, of the first state in which the plurality of rechargeable batteries is connected in series, and supplies a current to a load, and of the second state in which the rechargeable batteries are separated into respective single rechargeable batteries which are charged by a car battery.

Therefore, the charging/discharging circuit described in Reference 2 separately charges a plurality of rechargeable batteries so that it can reliably perform charging without being affected by the variation in each battery.

In addition, the charging/discharging circuit described in Reference 2 discharges a plurality of rechargeable batteries by connecting them in series so that it can supply a high voltage to a load.

However, the charging/discharging circuit described in Reference 2 does not detect the voltage across each of the terminals in charging or the voltage across terminals at both ends of the plurality of rechargeable batteries in discharging and, therefore, has a possibility of causing an overcharge or an overdischarge.

Moreover, on the one hand, because the battery is integrally formed with the charging/discharging circuit, the charging/discharging circuit described in Reference 2 has a disadvantage in terms of cost performance when the battery must be changed.

On the other hand, because the charging/discharging circuit described in Reference 1 detects the voltage across the terminals at both ends of a plurality of rechargeable lithium ion batteries during a discharge but does not measure the voltage across the terminals of each rechargable lithium ion battery, it cannot meet a situation in which any one of the rechargable lithium ion batteries has a voltage across its terminals lower than the minimum voltage of 2.5 V. It therefore has a problem such that it cannot avoid the risk of causing an overdischarge. In addition, because the charging/discharging circuit described in Reference 1 detects the voltage across the each terminals of a plurality of rechargable lithium ion batteries in charging, it can prevent an overcharge, but has a new problem such that, if any one of the lithium ion batteries becomes overcharged, charging stops and the other batteries which are not yet overcharged are no longer charged.

SUMMARY OF THE INVENTION

An object of the present invention is to provide a charging circuit which prevents an overcharge when a plurality of rechargeable batteries is being charged.

Another object of the present invention is to provide a discharging circuit which prevents an overdischarge when discharging a plurality of rechargeable batteries.

To attain the above objects, the present invention is provided with a charging circuit which separately charges a plurality of rechargeable batteries by using a dedicated charger having a constant-current circuit and a constant-voltage circuit.

Furthermore, the present invention comprises a detector portion for preventing an overdischarged state, being provided on each rechargeable battery and a warning portion for warning of the overdischarged state.

With the above arrangement, the present invention can separately charge a plurality of rechargeable batteries at a constant current and a constant voltage by using the dedicated charging circuit so that not even one of the rechargeable batteries is overcharged, and can reliably charge all of the rechargeable batteries.

3

Moreover, the present invention provides each rechargeable battery with a circuit preventing an overdischarge and a circuit warning of the overdischarged state so that, if even one of the rechargeable batteries reaches an overdischarge voltage, it can stop discharging and warn of the overdischarge.

BRIEF DESCRIPTION OF THE DRAWINGS

These and other objects, features, and advantages of the invention will become more fully apparent from the following detailed description taken in conjunction with the accompanying drawings.

DETAILED DESCRIPTION OF THE PREFERRED EMBODIMENT

Figure 1:
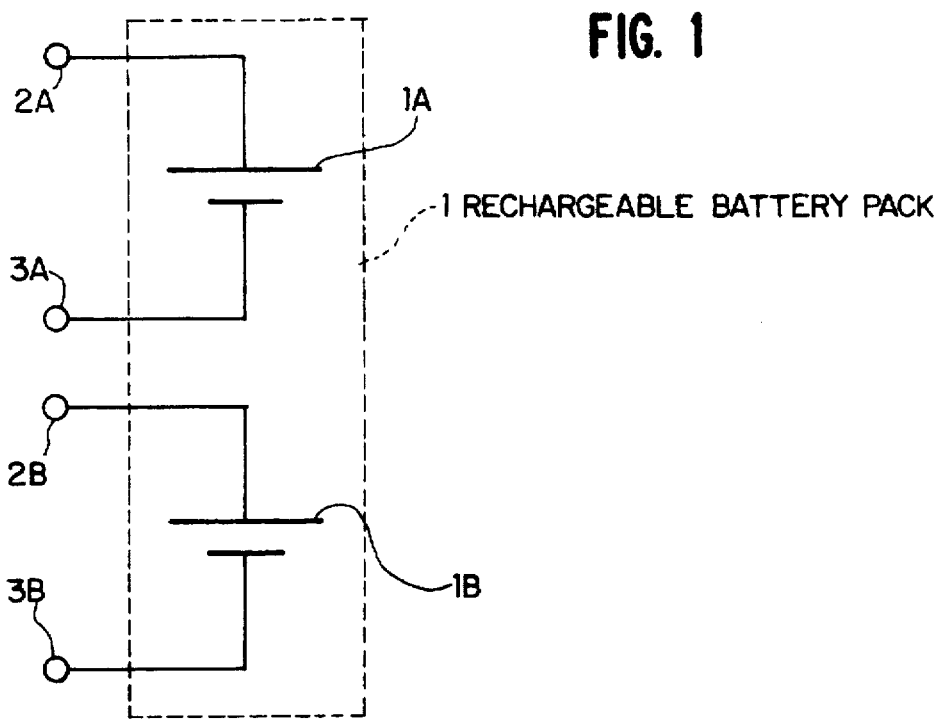
FIG. 1 is a block diagram of a battery pack including of a plurality of rechargeable batteries used for the present invention.

Shown in FIG. 1, a rechargeable battery pack 1 including of a plurality of rechargeable batteries used for the present invention contains rechargeable batteries 1A and 1B. Respective terminals 2A, 3A and 2B, 3B of the rechargeable batteries 1A and 1B are not connected within the package of the rechargeable battery pack 1, but taken out as separate external terminals.

Figure 2:
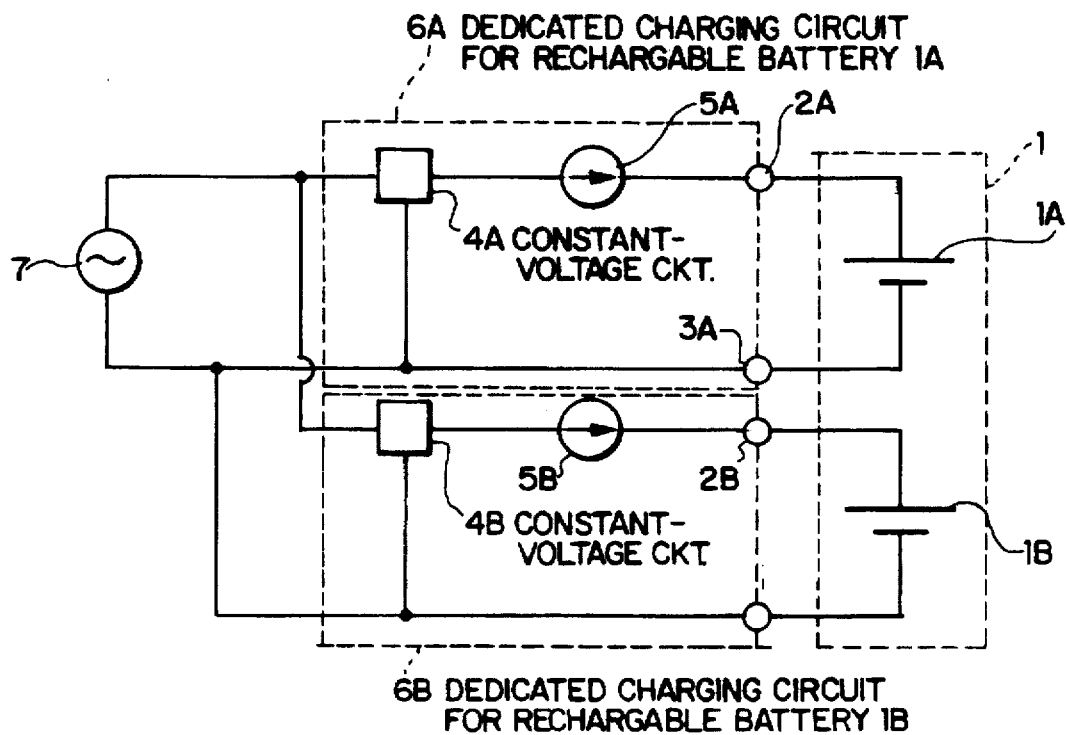
FIG. 2 is a block diagram of a charging circuit illustrating one embodiment of the present invention.

Shown in FIG. 2, the charging circuit of one embodiment of the present invention comprises a charging circuit 6A dedicated to the rechargeable battery 1A and a charging circuit 6B dedicated to the rechargeable battery 1B.

The charging circuit 6A dedicated to the rechargeable battery 1A comprises a constant-voltage circuit 4A outputting the maximum voltage, for example, 4.2 V, of the rechargeable battery 1A, and a constant-current circuit 5A supplying a charging current, and is connected in series to the rechargeable battery 1A through the terminals 2A and 3A of that battery. Similarly, the charging circuit 6B dedicated to the rechargeable battery 1B includes a constant-voltage circuit 4B outputting the maximum voltage of 4.2 V of the rechargeable battery 1B, and a constant-current circuit 5B supplying a charging current, and is connected in series to the rechargeable battery 1B through the terminals 2B and 3B of that battery. Furthermore, a direct current power supply 7 supplies power to the constant-voltage circuits 4A and 4B, and the constant-current circuits 5A and 5B.

Next, the operation of the charging circuit shown in FIG. 2 will be described.

First, when the rechargable battery pack 1 is installed on the charging circuit through the terminals 2A, 3A and 2B, 3B of the rechargable batteries 1A and 1B, the direct current power supply 7 supplies power to the charging circuits 6A and 6B dedicated to the secondary batteries 1A and 1B. The power is converted to provide a constant voltage and constant current by using the constant-voltage circuit 4A and 4B and the constant-current circuit 5A and 5B which constitute the charging circuits 6A and 6B. In such a case, the rechargable batteries 1A and 1B are separately charged by the dedicated charging circuits 6A and 6B so that neither one of the rechargable batteries is insufficiently charged, and each battery is sufficiently charged to its maximum voltage of 4.2 V. Because the battery is charged at a constant voltage and a constant current by using the constant-voltage circuits 4A

4 and 4B and the constant-current circuits 5A and 5B, voltage exceeding the maximum is not supplied to either rechargable battery.

Figure 3:
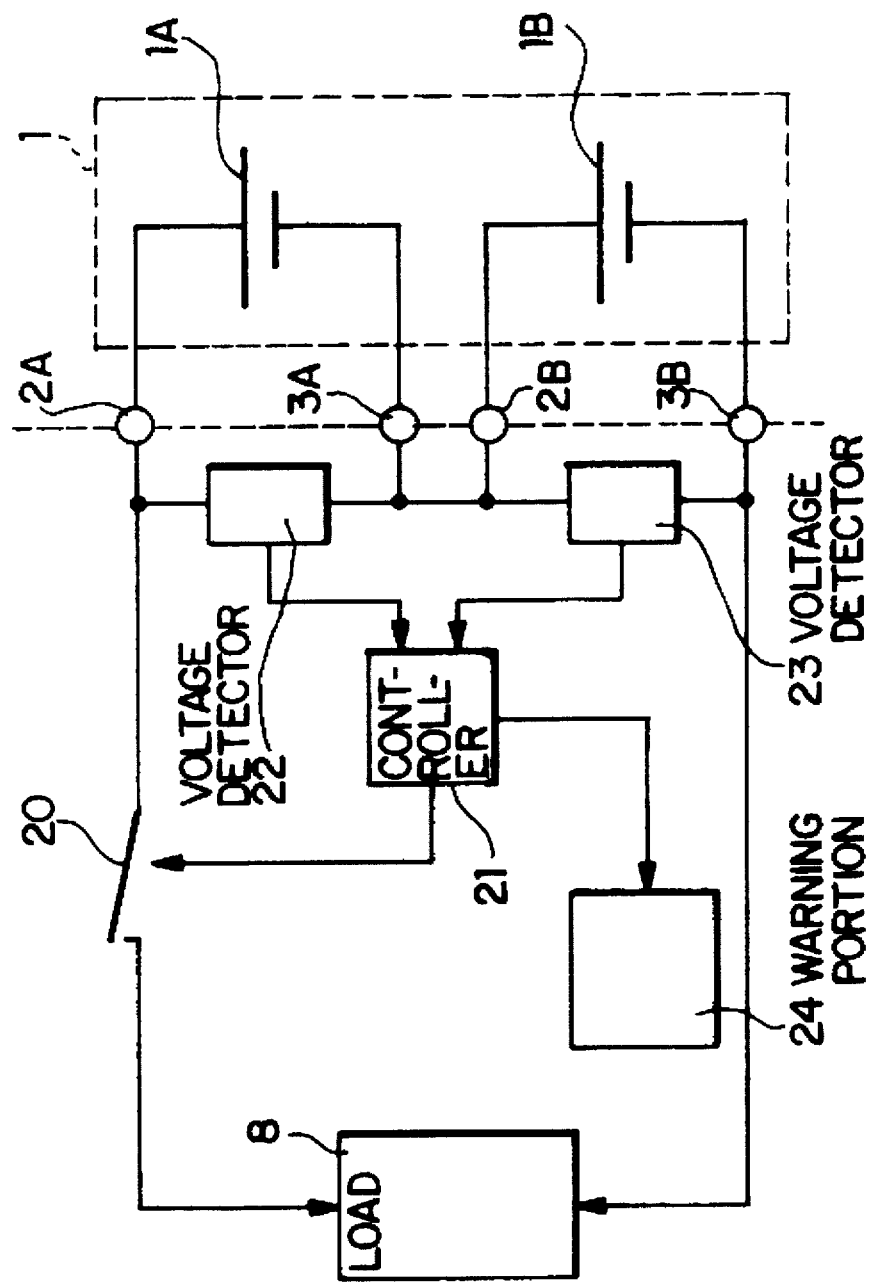
FIG. 3 is a block diagram of a discharging circuit illustrating one embodiment of the present invention.

Referring to FIG. 3, in the discharging circuit of one embodiment of the present invention, the terminals 3A and 2B of the each rechargeable batteries 1A and 1B which constitute the rechargeable battery pack 1 are connected to the rechargeable batteries 1A and 1B in series. In addition, a voltage detector 22 is connected to the terminals 2A and 3A of the rechargeable battery 1A to detect the voltage of the rechargeable battery 1A. Similarly, a voltage detector 23 is connected to the terminals 2B and 3B of the rechargeable battery 1B. Detection signals which are respectively output from these voltage detectors 22 and 23, detecting a voltage lower than the minimum voltage of the rechargeable battery, are supplied to a controller 21 formed of, for example, a NOR circuit. A control signal is output from the controller 21 in response to either one of the detection signals from the voltage detectors 22 and 23. The control signal is supplied to a switch 20 for controlling the presence or absence of the current supply to a load 8, such as a portable radio phone, and a warning portion 24 warning of the stoppage of the current supply. The load 8, such as a portable radio phone, is connected in series to the battery pack 1.

Next, the operation of the discharging circuit shown in FIG. 3 will be described. First, when the switch 20 is closed, the rechargeable batteries 1A and 1B are connected to the load 8 in series through the terminals 2A, 3A and 2B, 3B, and discharge while supplying a high voltage to the load 8. During this discharge, because the voltage detectors 22 and 23 detect the discharge voltage from each of the rechargeable batteries 1A and 1B, when either one of the rechargeable batteries 1A or 1B is in an overdischarged state lower than a minimum voltage of, for example, 2.5 V, the voltage detector 22 or 23 corresponding to that rechargeable battery detects the voltage lower than the minimum voltage. When the detection signal is sent to the controller 21, the controller 21 outputs a control signal as one of the voltage detectors 22 or 23 detects a voltage lower than the minimum voltage of 2.5 V. The control signal opens the switch 20 to stop the supply of current from the battery pack 1 to the load 8. At the same time, the control signal from the controller 21 is input to the warning portion 24, which in turn warns of the rechargeable battery pack 1 in the overdischarged state by generating an alarm signal, and prompts the stoppage of the discharge. It may possible to provide a detector portion for indicating overdischarged state in addition to the warning portion.

As described above, the present invention constitutes the rechargeable battery pack with a plurality of rechargeable batteries, and puts it out from the charging/discharging circuit incorporated in an internal device of a portable radio phone. So, it is advantageous in cost performance when the battery is replaced at the end of its life.

In addition, the charging circuit according to the present invention charges the battery reliably because it charges the battery at a constant voltage and a constant current with a dedicated charging circuit so that the rechargeable battery is never overcharged or charged insufficiently.

Furthermore, the discharging circuit according to the present invention connects the rechargeable battery pack to an internal circuit of a portable radio phone and the like, connects each rechargeable battery constituting the rechargeable battery pack in series in the device when discharging to supply a high voltage to the device, and provides each rechargeable battery and a warning portion of the overdischarged state with a circuit for preventing an overdischarged state so that it has the advantage of preventing an accident accompanying an overdischarge.

Obviously, numerous additional modifications and variations of the present invention are possible in light of the above findings. It is, therefore, to be understood that, within the scope of the appended claims, the invention may be practiced otherwise than as specifically described herein.

What is claimed is:

1. A system for preventing overdischarge of rechargeable batteries, comprising:

a battery pack having rechargeable batteries, wherein each of said batteries, within said battery pack, is free of an electrical connection with any other one of said batteries, said batteries each having respective terminals thereof connected to corresponding external terminals of said battery pack; and a discharging circuit for connecting with said external terminals to connect said batteries of said battery pack in series with a load, and including voltage detectors, each of which monitors a respective battery voltage of a corresponding one of said batteries, and each of which provides, when said respective battery voltage indicates overdischarge, an overdischarge detection signal to a controller which responds to said overdischarge detection signal by interrupting said connection of said batteries with said load.

2. The system of claim 1, wherein said controller interrupts said connection of said batteries with said load by providing a control signal to a switch, and said switch opens said connection in response to said control signal.

3. The system of claim 2, further comprising means for generating an alarm signal in response to said control signal.

4. The system of claim 3, wherein said alarm signal is a sound.

5. A system for preventing overdischarge of rechargeable batteries, comprising:

rechargeable batteries disposed in a battery pack, each of said batteries having a respective positive and a respective negative terminal, each said positive and each said negative terminal being electrically connected to a respective exterior terminal of said battery pack, and being free of any electrical connection with any other said positive and said negative terminal; and a discharging circuit connecting with said external terminals to connect said batteries of said battery pack in series with a load, and including voltage detectors, each of which monitors a respective battery voltage of a corresponding one of said batteries, and, when said respective battery voltage indicates overdischarge, directs said discharging circuit to stop discharging said corresponding one of said batteries.

6. A system for controlling discharge and recharge of batteries, comprising:

a battery pack having external terminals, and containing said batteries, each of said batteries having respective battery terminals, each of said terminals being coupled only to one of said external terminals of said battery pack;

a discharger comprising, for each of said batteries, a respective overdischarge detector circuit, and being removably coupled with said external terminals to form a series connection between said batteries and a load; and a charger comprising, for each of said batteries, a respective recharge circuit, and being removably coupled with said external terminals to form a respective dedicated connection between each of said batteries and said respective recharge circuit;

wherein said discharger is coupled with said external terminals during said discharge of said batteries, and said charger is coupled with said external terminals during said recharge of said batteries.

7. The system of claim 6, wherein:

each said overdischarge detector circuit monitors a respective battery voltage of a corresponding one of said batteries, and provides, when said respective battery voltage indicates overdischarge, an overdischarge detection signal to a controller to interrupt said series connection; and each said recharge circuit includes a respective constant voltage circuit and a respective constant current circuit connected to a power supply.

8. The system of claim 7, wherein said controller interrupts said connection of said external terminals with said load by providing a control signal to a switch, and said switch opens said connection in response to said control signal.

9. The system of claim 8, further comprising means for generating an alarm signal in response to said control signal.

10. The system of claim 9, wherein said alarm signal is a sound.

* * * * *